(12) United States Patent
Yeh

(10) Patent No.: US 7,378,184 B2
(45) Date of Patent: May 27, 2008

(54) BATTERY HOLDER

(75) Inventor: Jih-Chen Yeh, Taipei County (TW)

(73) Assignee: High Tech Computer, Corp., Tao Yuan (TW)

( * ) Notice: Subject to any disclaimer, the term of this patent is extended or adjusted under 35 U.S.C. 154(b) by 671 days.

(21) Appl. No.: 10/711,534

(22) Filed: Sep. 24, 2004

(65) Prior Publication Data
US 2005/0287423 A1  Dec. 29, 2005

(30) Foreign Application Priority Data
Jun. 29, 2004 (TW) .............................. 93210182 U

(51) Int. Cl.
*H01M 2/10* (2006.01)
(52) U.S. Cl. ........................................ 429/97; 429/100
(58) Field of Classification Search .................. 429/96, 429/97, 99, 100, 174
See application file for complete search history.

(56) References Cited

U.S. PATENT DOCUMENTS

| | | | | |
|---|---|---|---|---|
| 4,218,522 A | * | 8/1980 | Motoyoshi | ................... 429/97 |
| 4,501,805 A | * | 2/1985 | Yasuda et al. | .............. 429/174 |
| 5,805,423 A | * | 9/1998 | Wever et al. | ........... 429/100 X |
| 5,851,691 A | * | 12/1998 | Palmer et al. | ................. 429/97 |
| 5,980,309 A | * | 11/1999 | Frantz et al. | ............... 439/500 |
| 6,124,056 A | | 9/2000 | Kimura | ...................... 429/100 |
| 6,603,670 B1 | * | 8/2003 | Chien | .................... 429/100 X |

FOREIGN PATENT DOCUMENTS

| JP | 11-163745 | * | 6/1999 |
|---|---|---|---|
| JP | 2000-149898 | * | 5/2000 |

\* cited by examiner

*Primary Examiner*—Stephen J. Kalafut
(74) *Attorney, Agent, or Firm*—Jianq Chyun IP Office

(57) ABSTRACT

A battery holder (210) for mounting a button-type battery (200) on a printed circuit board (220) is provided. The battery holder comprises a resilient electrode plate (212), a ring (214) and a battery cap (216). The resilient electrode plate is soldered to positive contacts (222) of the printed circuit board. A positive electrode of the battery is put on and electrically connects with the resilient electrode plate to thereby connect electrically with the positive contacts on the printed circuit board. The ring is soldered to negative contacts (224) of the printed circuit board and surrounds the resilient electrode plate. The battery is accommodated within the ring. The battery cap is fixed and electrically connected to the ring and covers the battery. The battery cap also electrically contacts with a negative electrode (202) on a top of the battery. The negative electrode and positive electrode of the battery are separated by an insulation (206).

19 Claims, 3 Drawing Sheets

BATTERY HOLDER

CROSS-REFERENCE TO RELATED APPLICATION

This application claims the priority benefit of Taiwan application serial no. 93210182, filed Jun. 29, 2004.

BACKGROUND OF THE INVENTION

1. Field of the Invention

The present invention relates to a battery holder. More particularly, the present invention relates to a battery holder for mounting a button type battery on a printed circuit board.

2. Description of the Related Art

In the modern world of rapid changes, up to the minute information is transmitted through a system of networks. All kinds of electronic products including mobile phones, computers and audio-visual equipments are indispensable in our daily life. With the repeated advance in electronic technologies, more personalized and multifunctional electronic products are sold in the market. As the number of portable products proliferates, the need of backup batteries also increases. A backup battery, which usually is button type or coin type battery, is used in a portable electronic device to prevent lose of important information of the device when the power of the main battery incidentally runs out. A battery holder is used to mount the backup battery on a printed circuit board. The design of a battery holder is important because a good design often facilitates a simple, smooth and reliable assembly of the backup battery to the printed circuit board.

FIG. 1 is a perspective view showing a conventional battery holder for mounting of a backup battery 100 to a printed circuit board 114. As shown in FIG. 1, the battery 100 has a positive electrode and a negative electrode (not labeled) which are respectively disposed on top and the bottom surfaces of the battery 100 and separated from each other through an insulating layer 110. To identify the different electrodes of the battery 100, the positive electrode is marked with a "+" symbol. To mount the battery 100 to the printed circuit board, firstly the positive electrode and the negative electrode of the battery 100 are manually soldered to conductive terminals 102, 104, respectively. Then the conductive terminals 102, 104 are manually soldered to a positive contact 114b and a negative contact 114a respectively on the printed circuit board 114. Since the battery 110 is heat sensitive, the soldering of the terminals 102, 104 to the contacts 114a, 114b of the printed circuit board 114 can only achieved by manual operation, and cannot be performed by surface mount technology (SMT). Soldering by SMT has uniformly better quality than that by manual operation. Furthermore, SMT can be automatically operated, and, thus, can lower the manufacturing cost and have a better yield rate. Moreover, since the terminals 102, 104 are very small, to manually solder them to the contacts 114a, 114b is not an easy operation. To facilitate the soldering, a specially designed fixture must be deployed. Finally, when the battery 100 needs to be replaced, the soldering between the conductive terminals 102 and 104 and the printed circuit board 114 needs to be de-soldered and ten re-soldered after the battery 100 is replaced with a new one. Such de-soldering and re-soldering operations are very laborious. Moreover, with the positive electrode of the battery 100 facing up without any protection, an operator may carelessly touch the positive electrode of the battery 100, which may cause damage to the battery 100 and shorten the life thereof. Finally, without a foolproof design for the battery holder, an operator for mounting the battery 100 may inadvertently mount it to the printed circuit board 114 in an upside-down manner. When this happens, the battery 100 and/or associated circuits may be damaged.

In U.S. Pat. No. 6,124,056, a battery holder is disclosed. The battery holder comprises a housing and two electrical contacts. The housing is plastic molded and has retaining walls at two sides thereof. The contacts on each side of the housing have some flexibility for ensuring a good electrical contact with the battery. In addition, the bottom section of the housing has a slot permitting an electrical contact between a spring plate and a battery. Although the disclosed design is more reliable and convenient to mount a battery on a printed circuit board than the one shown in FIG. 1, a large number of small and complicated components are required to construct the battery holder of the U.S. Pat. No. 6,124,056; so the cost for producing this battery holder is high.

Therefore, the purpose of the present invention is to provide a battery holder free from the above-mentioned disadvantages of the prior art.

SUMMARY OF THE INVENTION

Accordingly, an objective of the present invention is to provide a battery holder that ensures a reliable and convenient mounting of a battery on a printed circuit board and dispenses with the need to conduct a soldering operation to the battery.

A second objective of the present invention is to provide a battery holder that is low cost and mounted to a printed circuit board by surface mounting technology. Furthermore, the battery holder facilitates a proper position of a battery in the battery holder, and an easy and safe replacement of the battery with a new battery when required.

To achieve these and other advantages and in accordance with the purpose of the invention, as embodied and broadly described herein, the invention provides a battery holder for mounting a button-type backup battery on a printed circuit board. The printed circuit board has positive contacts and negative contacts thereon. The battery is disposed inside the battery holder and electrically connected to to the positive and negative contacts of the printed circuit board via the battery holder. The battery holder mainly comprises a resilient electrode plate, a ring and a battery cap. The resilient electrode plate is soldered to the positive contacts of the printed circuit board. A positive electrode of the battery is put on the resilient electrode plate to connect electrically with the positive contacts on the printed circuit board via the resilient electrode plate. The ring is soldered to the negative contacts of the printed circuit board, surrounding the resilient electrode plate and accommodating the battery therein. The battery cap is fixed and electrically connected to the ring. The battery cap covers the battery and also forms an electrical contact with a negative electrode of the battery. The negative electrode is located on a top surface of the battery.

The resilient electrode plate is soldered to the positive contacts of the printed circuit board by surface mount technology (SMT). The resilient electrode plate has flexible arms extending upwardly and electrically engaging with the positive electrode of the battery.

The resilient electrode plate further comprises a plurality of soldering feet located alternately with the flexible arms; the soldering feet are soldered to the positive contacts on the printed circuit board by surface mount technology.

The resilient electrode plate, the ring and the battery cap are fabricated by stamping a stainless steel sheet, for example.

The ring has a bottom which is soldered to the negative contacts on the printed circuit board by surface mount technology.

The ring has an outer periphery defining a groove therein. The battery cap has a downwardly extending flanged portion, which has a plurality of protrusions thereon. The protrusions engage in the groove and electrically connect with the ring.

The battery cap has a top portion defining a step which fittingly covers a step formed on the negative electrode of the battery.

The top portion of the battery cap has at least a spring tab extending toward a center thereof. The tab has a downward protrusion electrically contacting with the negative electrode of the battery. The step of the battery cap is formed on the top portion thereof, between the spring tab and the flanged portion.

In assembly, firstly the resilient electrode plate and the ring are surface mounted to the printed circuit board. The battery is then put in the ring with the positive electrode of the battery being in contact with the flexible arms of the resilient electrode plate. Finally the battery cap is fastened to the ring with the downward protrusion on the spring tab electrically contacting with the positive electrode of the battery, and the protrusions on the flanged portion of the battery cap engaging in the groove of the ring.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENT

Figure 1:
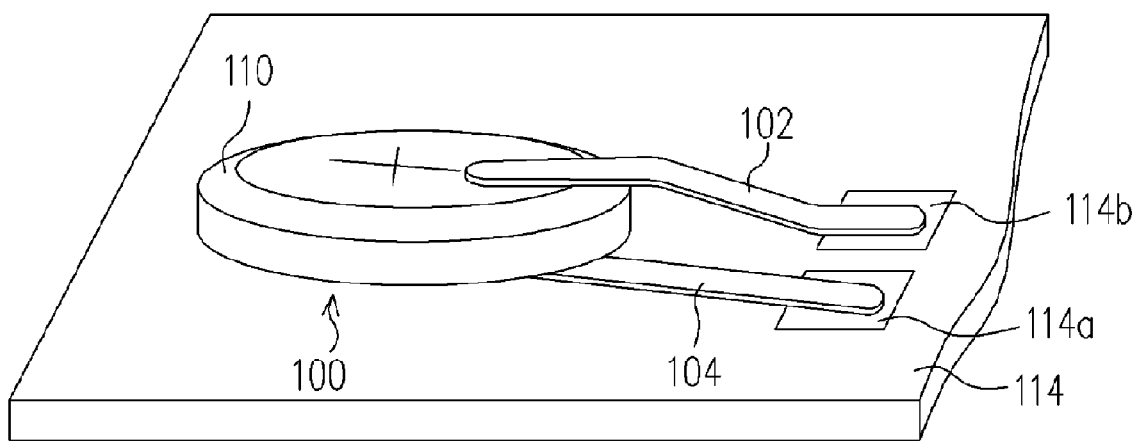
FIG. 1 is a perspective view showing a conventional battery holder for mounting of a battery to a printed circuit board.

Reference will now be made in detail to the present preferred embodiment of the invention, examples of which are illustrated in the accompanying drawings. Wherever possible, the same reference numbers are used in the drawings and the description to refer to the same or like parts.

Figure 2:
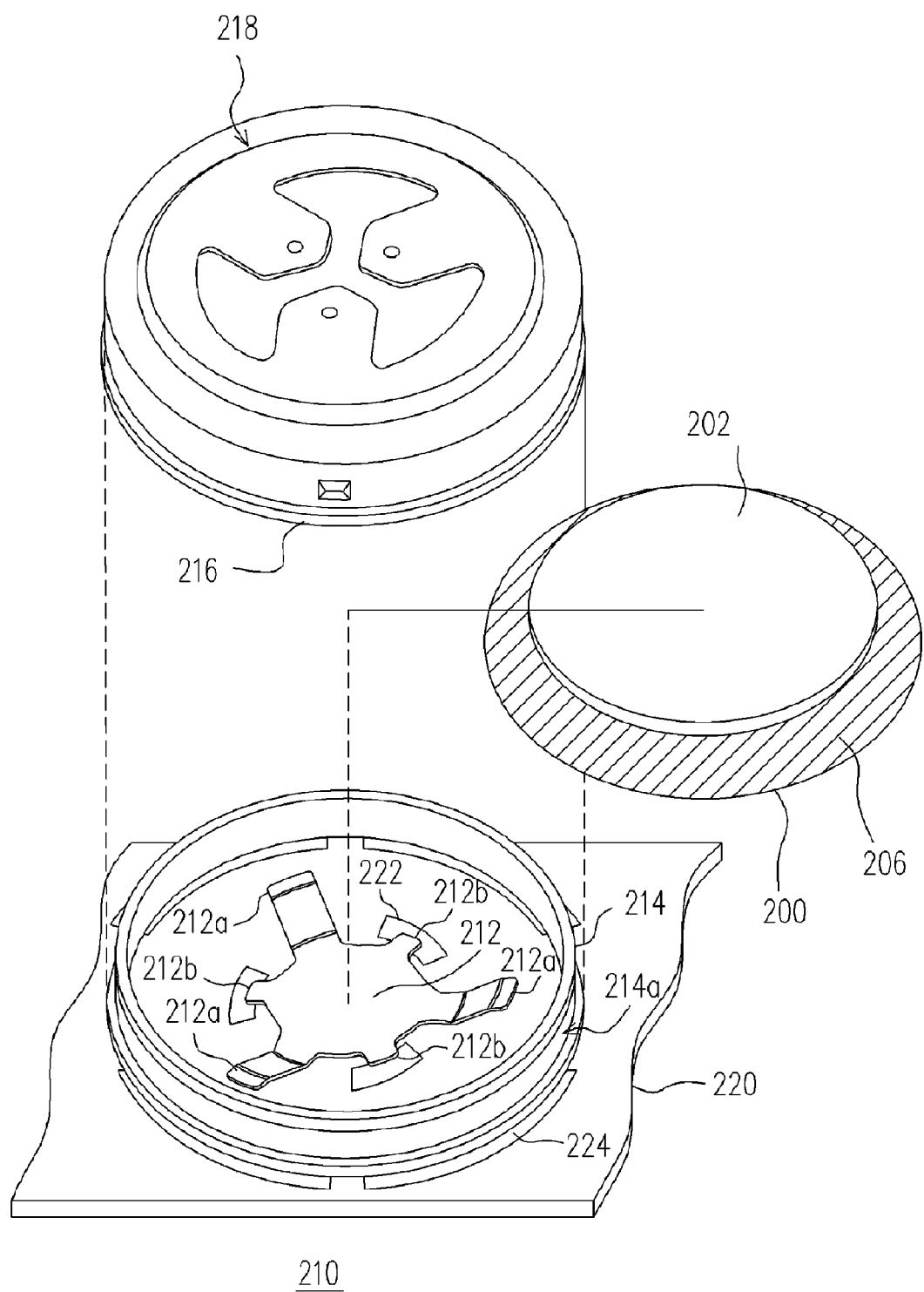
FIG. 2 is a perspective, exploded view of a battery holder and a button-type battery according to the present invention.

Referring to FIG. 2, the present invention is a battery holder 210 for mounting a battery 200 to a printed circuit board 220. The battery 200 is a button-type battery used as a back-up battery in a handheld electronic device (not shown) to supply power to the device when the main tower supply of the device incidentally runs out. The battery 200 has a positive electrode (cathode) (not labeled) and a negative electrode (anode) 202 located at bottom and the top surfaces of the battery 200, respectively. An insulation 206 surrounds a periphery of the battery 200 to separate the positive electrode from the negative electrode 202.

Still referring FIG. 2, the battery holder 210 mainly comprises a resilient electrode plate 212, a ring 214 and a battery cap 216. In assembly, the resilient electrode plate 212 and the ring 214 are firstly placed on the printed circuit board 220 and then they are together subjected to surface mount technology (SMT) so that soldering feet 212b of the resilient electrode plate 212 are soldered to positive contacts 222 of the printed circuit board 220, and a bottom face of the ring 214 is soldered to negative contacts 224 of the printed circuit board 220. In the present invention, the resilient electrode plate 212 further comprises a plurality of flexible arms 212a arranged among the soldering feet 212b in an alternate relationship. The flexible arms 212a are extended upwardly and outwardly from a central body (not labeled) of the plate 212.

Still referring to FIG. 2, the ring 214 is disposed on the printed circuit board 220 surrounding the resilient electrode plate 212 for accommodating the button-type battery 200 therein. The ring 214 has an outer periphery defining a groove 214a therein.

Figure 3:
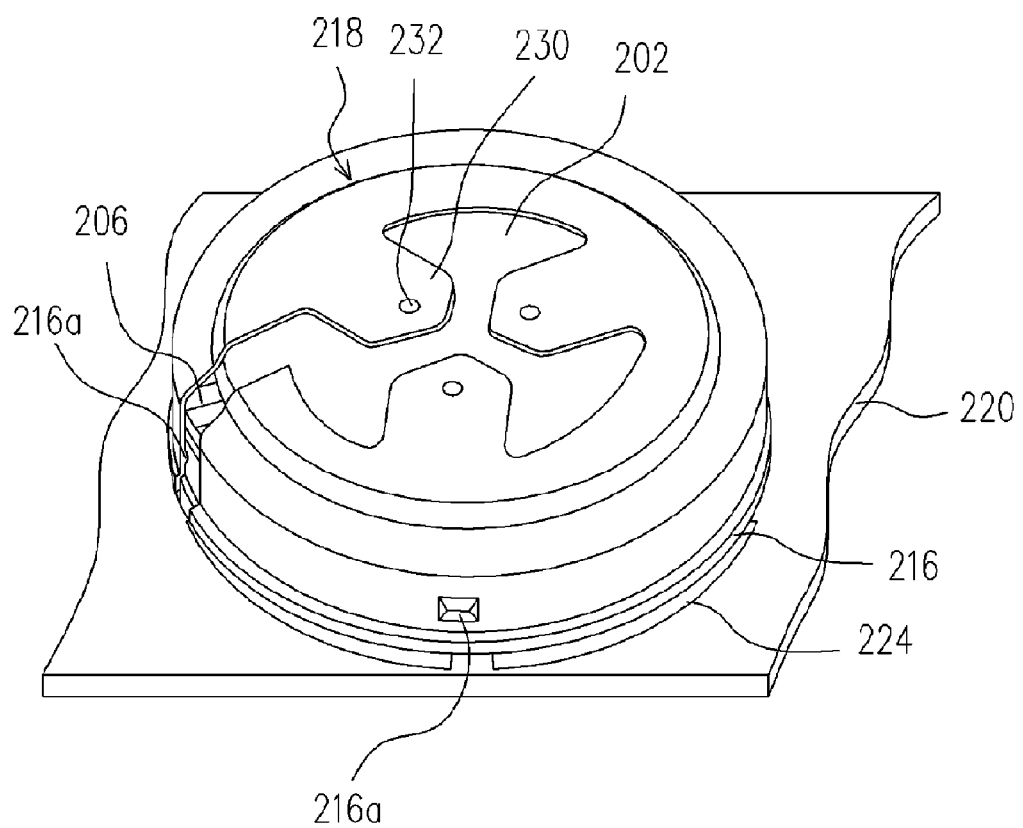
FIG. 3 is a perspective, assembled view of FIG. 2, with a portion being cut away to shown a connection between a ring and battery cap.

The battery cap 216 is used for covering and fastening to the ring 214 so that the negative electrode 202 of the battery 200 is electrically connected to the negative contacts 224 on the printed circuit board 220. The battery cap 216 is formed with a plurality of protrusions 216a (FIG. 3) on an inner surface of a lower, circular flanged portion (not labeled) of the cap 216. As shown in FIG. 3, when the cap 216 is assembled to the ring 214, the protrusions 216a engages in the groove 214a and in electrical connection with the ring 214.

Still referring to FIG. 3, the battery cap 216 has a top portion (not labeled) consisting of three spring tabs 230 extending toward a center thereof. Each spring tab 230 has a downward protrusion 232. The top portion further defines a step 218 between the tabs 230 and the lower, circular flanged portion. The step 218 is a raised step from an edge to the center of the top portion. The battery 200 has a corresponding step formed on the negative electrode 202 beside the insulation 206, which has a dimension and shape corresponding to the step 218. Due to the provision of the step 218 on the battery cap 216 and the step on the battery 200, the battery cap 216 can be properly assembled to the ring 214 only when the positive electrode of the battery 200 faces downwardly and the negative electrode 202 faces upwardly when the battery 200 is put in the ring 214. The design that the negative electrode 202 always faces upwardly prevents a careless touch of a user's finger with the positive electrode of the battery 200 when the battery 200 or the battery holder 210 is under a replacement or maintenance by the user. Such a careless touch may cause damage to the battery 200. When the battery 216 is assembled to the ring 214, the battery cap 216 covers the battery 200, the step 218 fittingly covers the step of the battery 200, and the protrusions 232 electrically engage with the negative electrode 202 of the battery 200 so that the negative electrode 202 is electrically connected to the negative contacts 224 through the battery cap 216 and the ring 214.

Accordingly, the resilient electrode plate 212, the ring 214 and the battery cap 216 constituting the battery holder 210 of the present invention have a simple structure and are easy to assemble together. Moreover, the resilient electrode plate 212 and the ring 214 can be soldered to the printed circuit board 220 simply using surface mount technology. The battery holder 210 of the present invention not only provides a device for restraining the battery 200 in place, but also provides a device which can easily, safely and reliably electrically connect the battery 200 to the printed circuit board 220.

In summary, major advantages of the battery holder 210 in accordance with the present invention includes:

1. Only three components, namely, a resilient electrode plate, a ring and a battery cap are required. These components are easy to manufacture and easy to assemble together into the battery holder in accordance with the present invention.

2. The resilient electrode plate, the ring and the battery cap are fabricated by stamping a stainless steel sheet so that they can withstand a higher temperature without deformation. In addition, surface mount technology can be used to solder the resilient electrode plate and the battery cap to the printed circuit board.

3. The battery can be detached from the battery holder without damaging the printed circuit board or the battery itself. In addition, the foolproof design of the battery cap ensure a correct placement of the battery in the battery holder so that an inadvertent contact of a user's finger with a positive electrode of the battery is avoided.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A battery holder mounting a battery to a printed circuit board having a positive contact and a negative contact, the battery holder comprising:
   a resilient electrode plate disposed on the printed circuit board and electrically connected to the positive contact, wherein the battery has a positive electrode electrically connected to the resilient electrode plate;
   a ring surrounding the resilient electrode plate, accommodating the battery therein and electrically connected to the negative contact of the printed circuit board; and
   a battery cap fastened to and electrically connected with the ring, the battery cap covering a top of the ring, the battery having a negative electrode electrically connected with the battery cap having a step fittingly covering a step of the negative electrode of the battery.

2. The battery holder of claim 1, wherein the resilient electrode plate and ring are soldered to the positive and negative contacts of the printed circuit board by surface mount technology (SMT).

3. The battery holder of claim 2, wherein the resilient electrode plate comprises a foot soldered to the positive contact of the printed circuit board, and a flexible arm extending upwardly and engaging with the positive electrode of the battery.

4. The battery holder of claim 1, wherein the battery cap engages an outer periphery of the ring.

5. The battery holder of claim 4, wherein the outer periphery of the ring defines a groove, and the battery cap has at least a protrusion engaging in groove.

6. The battery holder of claim 1, wherein the battery has an insulation between the positive electrode and the negative electrode thereof, and the step of the negative electrode of the battery is located beside the insulation.

7. The battery holder of claim 6, wherein the battery cap has a spring tab extending toward a center thereof, the spring tab electrically engaging with the negative electrode of the battery.

8. The battery holder of claim 7, wherein the spring tab has a downward protrusion electrically engaging with the negative electrode of the battery.

9. A battery holder assembly comprising:
   a battery having a positive electrode and a negative electrode;
   a printed circuit board having a positive contact and a negative contact;
   a resilient electrode plate soldered to the positive contact of the printed circuit board, wherein the battery is placed on top of the resilient electrode plate and the positive electrode of the battery is electrically connected to the positive contact via the resilient electrode plate;
   a ring soldered to the negative contact of the printed circuit board, surrounding the battery and the resilient electrode plate; and
   a battery cap fastened to top of the ring and the battery and electrically connected to the negative electrode of the battery and the ring, wherein the battery cap has a step fittingly covering a step of the negative electrode of the battery.

10. The battery holder assembly of claim 9, wherein the battery cap has a top portion and a flanged portion extending downwardly from an edge of the top portion.

11. The battery holder assembly of claim 10, wherein the ring has a circular groove and the battery cap has a protrusion engaging in the circular groove and electrically connected with the ring.

12. The battery holder assembly of claim 11, wherein the resilient electrode plate has alternately positioned flexible arms and soldering feet, the soldering feet being soldered to the positive contact of the printed circuit board, and the arms being upwardly extended away from the printed circuit board and electrically engaging with the positive electrode of the battery.

13. The battery holder assembly of claim 12, wherein the battery cap further comprises at least a spring tab extending toward a center of the top portion of the battery cap, the at least a spring tab having a downward protrusion electrically contacting with the negative electrode of the battery.

14. The battery holder assembly of claim 10, wherein the battery has an insulation between the negative electrode and positive electrode, and the step of the negative electrode of the battery is located beside the insulation.

15. The battery holder assembly of claim 11, wherein the protrusion of the battery cap engaging in the circular groove of the ring is formed on the flanged portion of the battery cap.

16. The battery holder assembly of claim 15, wherein the resilient electrode plate and the ring are soldered to the printed circuit board by surface mount technology.

17. A battery holder assembly comprising;
   a printed circuit board;
   a resilient electrode plate soldered to the printed circuit board;
   a ring soldered to the printed circuit board and surrounding the resilient electrode plate;
   a battery accommodated in the ring and electrically connected with the resilient electrode plate; and
   a battery cap covering the battery, fastened to and electrically connected with the ring, and electrically connecting with the battery, wherein the battery cap has a step fittingly covering a step of a negative electrode of the battery.

18. The battery holder assembly of claim 17, wherein the battery has an anode electrically connected with the resilient electrode plate, and the negative electrode electrically connected with the battery cap.

19. The battery holder assembly of claim 17, wherein the battery cap has a top portion having a spring tab electrically engaging with the negative electrode of the battery, and a flanged portion downwardly extending from the top portion and electrically engaging with the ring.

* * * * *